(12) United States Patent
Hao et al.

(10) Patent No.: US 11,127,924 B2
(45) Date of Patent: Sep. 21, 2021

(54) DISPLAY DEVICES CONTAINING POLYMERIC FILMS

(71) Applicant: 3M INNOVATIVE PROPERTIES COMPANY, St. Paul, MN (US)

(72) Inventors: Encai Hao, Woodbury, MN (US); Zhaohui Yang, North Oaks, MN (US); Albert I. Everaerts, Tucson, AZ (US); Yongshang Lu, Woodbury, MN (US); William Blake Kolb, Stillwater, MN (US); Keith R. Bruesewitz, River Falls, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 23 days.

(21) Appl. No.: 16/674,482

(22) Filed: Nov. 5, 2019

(65) Prior Publication Data

US 2020/0067019 A1 Feb. 27, 2020

Related U.S. Application Data

(63) Continuation of application No. PCT/US2018/030896, filed on May 3, 2018, which is
(Continued)

(51) Int. Cl.
*H01L 51/52* (2006.01)
(52) U.S. Cl.
CPC ...... *H01L 51/5253* (2013.01); *H01L 51/5246* (2013.01); *H01L 51/5275* (2013.01)
(58) Field of Classification Search
None
See application file for complete search history.

(56) References Cited

U.S. PATENT DOCUMENTS 7,241,437 B2 7/2007 Davidson
8,343,622 B2 1/2013 Liu
(Continued)

FOREIGN PATENT DOCUMENTS

DE 102013109898 3/2015
WO WO 2008-128073 10/2008
(Continued)

OTHER PUBLICATIONS

Koh, "Enhanced Outcoupling in Organic Light-Emitting Diodes via a High-Index Contrast Scattering Layer," ACS Photonics, Aug. 2015, vol. 2, pp. 1366-1372.
(Continued)

*Primary Examiner* — Jay C Chang

(57) ABSTRACT

Display devices that include: an organic light emitting diode panel having a multilayer construction including one or more adhesive films; and a polymeric film incorporated within the multilayer construction of the organic light emitting diode panel. The polymeric film includes: a first polymeric layer having two major surfaces, wherein the first polymeric layer includes: a first polymer region including a first material having a refractive index of $n_1$; a second region including a network of interconnected pores and channels within the first polymer region; wherein the pores and channels comprise a second material having a refractive index of $n_2$; wherein $n_1$ is different than $n_2$; wherein the first material includes a first elastic polymeric material and optional particles; and wherein the second material includes: a second polymeric material and optional particles; and/or air; and wherein the polymeric film has: a clarity of at least 90%; a visible light transmission of at least 80%; and a bulk haze of 25% to 80%.

18 Claims, 6 Drawing Sheets

Related U.S. Application Data a continuation of application No. 15/587,929, filed on May 5, 2017, now abandoned.

(56) References Cited

U.S. PATENT DOCUMENTS

| | | |
|---|---|---|
| 8,427,747 B2 | 4/2013 | Le |
| 8,469,551 B2 | 6/2013 | Wolk |
| 8,538,224 B2 | 9/2013 | Lamansky |
| 8,547,015 B2 | 10/2013 | Wolk |
| 8,557,378 B2 | 10/2013 | Yamanaka |
| 8,692,446 B2 | 4/2014 | Zhang |
| 8,808,811 B2 | 8/2014 | Kolb |
| 9,279,918 B2 | 3/2016 | Haag |
| 9,541,701 B2 | 1/2017 | Thompson |
| 2009/0087629 A1 | 4/2009 | Everaerts |
| 2010/0028564 A1 | 2/2010 | Cheng |
| 2010/0040842 A1 | 2/2010 | Everaerts |
| 2011/0126968 A1 | 6/2011 | Determan |
| 2012/0038990 A1 | 2/2012 | Hao |
| 2012/0098421 A1* | 4/2012 | Thompson .......... H01L 51/5262 313/512 |
| 2012/0099323 A1* | 4/2012 | Thompson .......... H01L 51/5275 362/257 |
| 2013/0181242 A1 | 7/2013 | Cho |
| 2013/0193416 A1 | 8/2013 | Shin |
| 2014/0299844 A1 | 10/2014 | You |
| 2016/0001521 A1 | 1/2016 | Tanaka |
| 2016/0155967 A1 | 6/2016 | Lee |

FOREIGN PATENT DOCUMENTS

| | | |
|---|---|---|
| WO | WO 2009-085926 | 7/2009 |
| WO | WO 2009-089137 | 7/2009 |
| WO | WO 2012-054165 | 4/2012 |

OTHER PUBLICATIONS

Pyo, "A Nanoporous Polymer Film as a Diffuser as Well as a Light Extraction Component for Top Emitting Organic Light Emitting Diodes With a Strong Microcavity Structure," Nanoscale, Mar. 2016, vol. 8, pp. 8575-8582.

Suh, "Suppression of the Viewing Angle Dependence by Introduction of Nanoporous Diffuser Film on Blue OLEDs With Strong Microcavity Effect," Organic Electronics, 2016, vol. 28, pp. 31-38.

* cited by examiner

DISPLAY DEVICES CONTAINING POLYMERIC FILMS

BACKGROUND

Organic light emitting diodes (OLEDs) currently are used in small-screen devices such as cell phones, personal display devices (PDAs), and digital cameras. Current OLED markets are dominated by active-matrix organic light-emitting diode (AMOLED) handhelds, which have a top-emissive architecture and currently do not use any light extraction method except for employing strong microcavity. This strong cavity design can have high light efficiency, but the angular color uniformity is much worse, when compared to that of liquid crystal displays (LCDs).

Typically, the color for an OLED screen shifts greatly as viewing angle increases away from normal incidence, but an LCD display shifts only slightly. This is a visually evident difference between the two display technologies. How to improve the angular color uniformity remains a challenge for AMOLED displays with strong cavity design.

SUMMARY OF THE DISCLOSURE

The present disclosure provides polymeric films and display devices including such polymeric films.

In one embodiment, a display device includes: an organic light emitting diode panel having a multilayer construction including one or more adhesive films; and a polymeric film incorporated within the multilayer construction of the organic light emitting diode panel. Such a polymeric film has the optical function of a very moderate optical diffuser with controlled local uniformity.

The polymeric film includes: a first polymeric layer having two major surfaces. The first polymeric layer includes: a first polymer region including a first material having a refractive index of $n_1$; a second region comprising a network of interconnected pores and channels within the first polymer region; wherein the channels comprise a second material having a refractive index of $n_2$; wherein $n_1$ is different than $n_2$. The first material includes a first elastic polymeric material and optional particles. The second material includes: a second polymeric material and optional particles; and/or air. The polymeric film has: a clarity of at least 90%; a visible light transmission of at least 80%; and a bulk haze of 25% to 80%. In certain embodiments, the polymeric film has a normalized micro-haze non-uniformity of not more than 12% across the polymeric film.

The term "haze" refers to wide angle light scattering, wherein light emitting from a display is diffused in all directions causing a loss of contrast. More particularly, the term "bulk haze" refers to the wide angle light scatter measured with a broad sampling beam of several millimeters (mm) so as to give an average result from said several-millimeter aperture of the polymeric film. Also, more particularly, the term "micro-haze" refers to wide angle light scattering as measured by a smaller illuminated area of tens of microns (i.e., less than 100 microns, e.g., 10 to 40 microns) such that the average micro-haze measurement represents the average result from many measurements, each tens of microns in area, extending over several millimeters of the polymeric film.

The term "normalized micro-haze non-uniformity" refers to the ratio of the standard deviation of the micro-haze to the average value of micro-haze when measured over at least 1 mm, and typically over several millimeters. The standard deviation of micro-haze is a measure of micro-haze noise. As such, normalized micro-haze non-uniformity is a metric for the ratio of visual micro-haze noise to micro-haze signal.

The term "clarity" refers to narrow angle scattering, wherein light is diffused in a small angle range with high concentration. The effect of having a certain clarity basically describes how well very small details can be seen through a specimen.

The terms "polymer" and "polymeric material" include, but are not limited to, organic homopolymers, copolymers, such as for example, block, graft, random, and copolymers, terpolymers, etc., and blends and modifications thereof. Furthermore, unless otherwise specifically limited, the term "polymer" shall include all possible geometrical configurations of the material. These configurations include, but are not limited to, isotactic, syndiotactic, and atactic symmetries.

Herein, the term "comprises" and variations thereof do not have a limiting meaning where these terms appear in the description and claims. Such terms will be understood to imply the inclusion of a stated step or element or group of steps or elements but not the exclusion of any other step or element or group of steps or elements. By "consisting of" is meant including, and limited to, whatever follows the phrase "consisting of." Thus, the phrase "consisting of" in dictates that the listed elements are required or mandatory, and that no other elements may be present. By "consisting essentially" of is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they materially affect the activity or action of the listed elements.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

In this application, terms such as "a," "an," and "the" are not intended to refer to only a singular entity, but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

Also herein, all numbers are assumed to be modified by the term "about" and in certain embodiments, preferably, by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

As used herein, the term "room temperature" refers to a temperature of 20° C. to 25° C. or 22° C. to 25° C.

The term "in the range" or "within a range" (and similar statements) includes the endpoints of the stated range.

Groupings of alternative elements or embodiments disclosed herein are not to be construed as limitations. Each group member may be referred to and claimed individually or in any combination with other members of the group or other elements found therein. It is anticipated that one or more members of a group may be included in, or deleted from, a group for reasons of convenience and/or patentability. When any such inclusion or deletion occurs, the specification is herein deemed to contain the group as modified thus fulfilling the written description of all Markush groups used in the appended claims.

Reference throughout this specification to "one embodiment," "an embodiment," "certain embodiments," or "some embodiments," etc., means that a particular feature, configuration, composition, or characteristic described in connection with the embodiment is included in at least one embodiment of the invention. Thus, the appearances of such phrases in various places throughout this specification are not necessarily referring to the same embodiment of the invention. Furthermore, the particular features, configurations, compositions, or characteristics may be combined in any suitable manner in one or more embodiments.

The above summary of the present disclosure is not intended to describe each disclosed embodiment or every implementation of the present invention. The description that follows more particularly exemplifies illustrative embodiments. In several places throughout the application, guidance is provided through lists of examples, which examples may be used in various combinations. In each instance, the recited list serves only as a representative group and should not be interpreted as an exclusive list.

DETAILED DESCRIPTION OF ILLUSTRATIVE EMBODIMENTS

Figure 1:
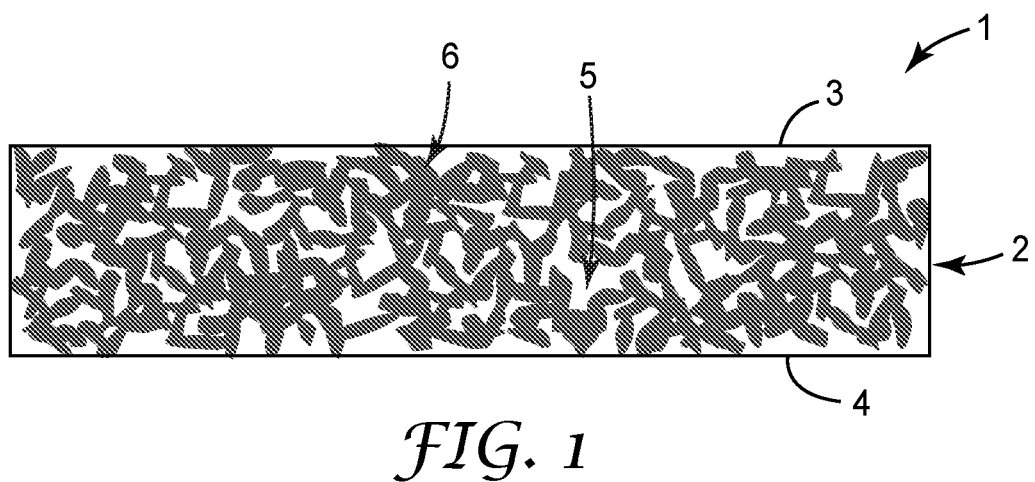
FIG. 1 is a cross-sectional representation of the polymeric film of the present disclosure.

The present disclosure provides polymeric films and display devices that include these polymeric films. The polymeric film has the optical function of a very moderate optical diffuser.

The polymeric film includes: a first polymeric layer having two major surfaces. a first polymer region including a first material having a refractive index of $n_1$; a second region comprising a network of interconnected pores and channels within the first polymer region; wherein the channels comprise a second material having a refractive index of $n_2$; wherein $n_1$ is different than $n_2$. The first material includes a first elastic polymeric material and optional particles. The second material includes: a second polymeric material and optional particles; and/or air.

The polymeric film has: a clarity of at least 90%; a visible light transmission of at least 80%; and a bulk haze of 25% to 80%. In certain embodiments, the polymeric film has a normalized micro-haze non-uniformity of not more than 12% across the polymeric film.

The first material includes a first elastic polymeric material and optional particles. The first material forms a porous structure with a network of interconnected pores (i.e., voids) and channels. That is, the pores and channels are defined by the first polymer region.

Typically, the plurality of interconnected pores and channels includes pores connected to one another via hollow tunnels or tunnel-like passages. In certain embodiments, in a network there can be multiple pluralities of interconnected pores and channels. In certain embodiments, there can be minor amounts of closed or unconnected pores (i.e., voids).

Typically, the pores and channels have an average cross-section (e.g., diameter for spherical pores) of no greater than 2 microns. Alternatively stated, the network of interconnected pores and channels possess angular-averaged scattering properties that are similar to a scattering particle of less than 2 microns in size. The term angular-averaged scattering property has the following significance: The scattering centers of irregular shapes have scattering properties such as scattering cross section and scattering angle which are highly dependent of the impinging light angle. The angular-averaged scattering property takes the impinging light angle into account, and presents the averaged property of all the impinging light angles.

In certain embodiments, a volume fraction of the plurality of interconnected pores and channels is at least 10%.

The first polymeric material is typically a cured product of multifunctional monomers and/or oligomers. In certain embodiments, the first polymeric material includes an organic polymer selected from the group of an acrylate, a polyolefin, a polyurethane, a silicone, a polyester, and a combination thereof. In certain embodiments, the first polymeric material includes a cured product of multifunctional (meth)acrylate monomers and/or oligomers (wherein (meth) acrylate includes methacrylates and acrylates).

The polymeric material is sufficiently elastic to support the porous structure such that the pores and channels do not collapse. In this context, a "elastic" material may be a soft or hard elastic material, but not a viscous or visco-elastic material that would slowly fill in the porous structure due to material flow.

Examples of multifunctional monomers that can form the first polymeric material include trimethylolpropane triacrylate (commercially available from Sartomer Company, Exton, Pa. under the trade designation SR351), ethoxylated trimethylolpropane triacrylate (commercially available from Sartomer under the trade designation SR454), pentaerythritol tetraacrylate, pentaerythritol triacrylate (commercially available from Sartomer under the trade designation SR444), dipentacrythritol pentaacrylate (commercially available from Sartomer under the trade designation SR399), ethoxylated pentaerythritol tetraacrylate, ethoxylated pentacrythritol triacrylate (from Sartomer under the trade designation SR494), dipentaerythritol hexaacrylate, and tris(2-hydroxyethyl)isocyanurate triacrylate (from Sartomer under the trade designation SR368), 1,6-hexanediol diacrylate (from Sartomer under trade name of SR238), and (meth)acrylate functionalized oligomers. Examples of such oligomers include those resins with high tensile strength and high elongation, for example, CN9893, CN902, CN9001, CN961, and CN964 that are commercially available from Sartomer Company; and EBECRYL 4833 and Eb8804 that are commercially available from Cytec Industries, Woodland Park, N.J.). Suitable materials also include combinations of "hard" oligomeric acrylates and "soft" oligomeric acrylates. Examples of "hard" acrylates include polyurethane acrylates such as EBECRYL 4866, polyester acrylates such as EBECRYL 838, and epoxy acrylates such as EBECRYL 600, EBECRYL 3200, and EBECRYL 1608 (commercially available from Cytec); and CN2920. CN2261, and CN9013 (commercially available from Sartomer Company). Examples of the "soft" acrylates include EBECRYL 8411 that is commercially available from Cytec; and CN959, CN9782, and CN973 that are commercially available from Sartomer Company. Suitable materials are disclosed, for example, in U.S. Pat. No. 9,541,701 B2 (Thompson et al).

In certain embodiments, the first material also includes particles to help control morphology. In certain embodiments, the particles are nanoparticles, optionally surface-modified nanoparticles. Examples of such particles include $SiO_2$ (e.g., A174-treated NALCO 2329K silica particles, surface-modified MP4540M silica particles from Nissan Chemical America), $ZrO_2$, $TiO_2$, $SnO_2$, and combinations thereof. Preferred particles are $SiO_2$. Examples of such particles are disclosed, for example, in U.S. Pat. Appl. Publ. No. 2012/0038990 A1 (Hao et al). The amount of particles in the first material can be up to 60 wt-%, based on the total weight of the first material.

The preparation of the porous structure defined by the first polymeric material is disclosed, for example, in U.S. Pat. Appl. Publ. No. 2012/0038990 A1 (Hao et al.) and U.S. Pat. No. 8,808,811 B2 (Kolb et al). In one process, first a solution is prepared that includes a polymerizable material dissolved in a solvent, where the polymerizable material can include, for example, one or more types of monomers, optionally additives such as coupling agents, crosslinkers, and initiators, and optionally a plurality of particles, such as nanoparticles. Next the polymerizable material is polymerized, for example, by applying heat or light, to form an insoluble polymer matrix in the solvent. In some cases, after the polymerization step, the solvent may still include some of the polymerizable material, although at a lower concentration. Next, the solvent is removed by drying or evaporating the solution resulting in a first polymeric matrix that includes a network of interconnected channels dispersed in the polymer binder. Optionally, the first polymeric matrix includes a plurality of particles dispersed in the first polymeric matrix. If used, the particles are bound within the first polymeric matrix, where the bonding can be physical or chemical.

In certain embodiments, the first material is present in the first polymeric layer in an amount of at least 35 vol-%, based on the total volume of the polymeric film. In certain embodiments, the first material is present in the first polymeric layer in an amount of up to 90 vol-%, based on the total volume of the polymeric film.

The polymeric film of present disclosure can be made utilizing a network of pores and channels within the first material as the "host" that is completely or even partially filled with the second material. The second material has a mismatched refractive index with that of the first material. Typically the difference of refractive index between the first and second materials is at least 0.01 unit. With completely filling of the pores and channels with a polymeric material, the original "air voids" will be displaced by the "guest" polymeric phase in the first polymeric "host" phase. The optical properties of the resulting polymeric film of present disclosure can be determined by the difference of refractive index between the first ($n_1$) and second ($n_2$) polymeric materials and the unique morphology of those two intermixed materials.

In certain embodiments, the network of pores and channels is filled with air. In certain embodiments, the network of pores and channels is filled with a second polymeric material and optionally particles. In certain embodiments, the network of pores and channels is filled with a mixture of air and a second polymeric material (optionally mixed with particles). The air, the second polymeric material (optionally mixed with particles), or a mixture thereof, are referred to herein as the second material, and the plurality of interconnected pores and channels that is filled with the second material is referred to herein as the second interconnected region.

Thus, herein the first material defines a first polymer region including a first material having a refractive index of $n_1$. A second interconnected region including a second material having a refractive index of $n_2$ forms an interpenetrating network within the first material.

If the second material includes a polymeric material, the second polymeric material includes an organic polymer selected from the group of an acrylate, a polyolefin, a polyurethane, a silicone, a polyester, and a combination thereof. Particles may also be mixed with the second polymeric material to control the refractive index. In certain embodiments, the particles are nanoparticles, optionally surface-modified nanoparticles. Examples of such particles include $TiO_2$, $ZrO_2$, $SnO_2$, as well as some mixed metal oxides such as HX-305M5, a mixture of $SnO_2/ZrO_2/SbO_2$, manufactured by Nissan Chemical America, Houston, Tex. Examples of such particles are disclosed, for example, in U.S. Pat. No. 8,343,622 (Liu et al). The amount of particles in the second material can be up to 80 vol-%, based on the total volume of the second material.

If the second material includes a polymeric material, such polymeric material is typically present in the polymeric film in an amount of at least 10 vol-%, based on the total volume of the polymeric film. If the second material includes a polymeric material, such polymeric material is typically present in the polymeric film in an amount of up to 65 vol-%, based on the total volume of the polymeric film.

The first material (of the first polymer region) has a refractive index of $n_1$. The second material (of the second interconnected region) has a refractive index of $n_2$. The materials of these regions are selected such that $n_1$ is different than $n_2$. In certain embodiments, $n_1$ is at least 0.01 unit different than $n_2$. In certain embodiments, $n_1$ is at least 0.02 unit, or at least 0.03 unit, or at least 0.04 unit, or at least 0.05 unit, or at least 0.1 unit, different than $n_2$. In certain embodiments, $n_1$ is at most 0.5 unit different than $n_2$, In certain embodiments, $n_1$ is within 0.5 unit of $n_2$, $n_1$ is within 0.4 unit of $n_2$, $n_1$ is within 0.3 unit of $n_2$, $n_1$ is within 0.2 unit of $n_2$, or $n_1$ is within 0.1 unit of $n_2$. In this context "within" means within 0.5 unit (or 0.4 unit, or 0.3 unit, or 0.2 unit, or 0.1 unit) higher or lower.

In certain embodiments, the first polymeric layer is the only polymeric layer of the polymeric film of the present disclosure. In certain embodiments, the first polymeric layer is one of two or more polymeric layers of the polymeric film of the present disclosure. In certain embodiments, the first polymeric layer is one of two polymeric layers of the polymeric film of the present disclosure.

As shown in FIG. 1, in certain embodiments, polymeric film 1 includes a polymeric layer 2 having two major surfaces 3 and 4, wherein the polymeric layer 2 includes a first polymer region 5 including a first material having a refractive index of $n_1$; a second region including a network of interconnected pores and channels 6 within the first polymer region 5, which is filled with a second material having a refractive index of $n_2$. The second material within the interconnected pores and channels 6 may be air, a polymeric material, or a combination thereof.

In certain embodiments, the polymeric film of the present disclosure includes a second polymeric layer disposed on one or both major surface(s) of the first polymeric layer; wherein the second polymeric layer comprises a third polymeric material having a refractive index $n_3$; wherein the first polymeric material and the third polymeric material are the same or different.

Figure 2:
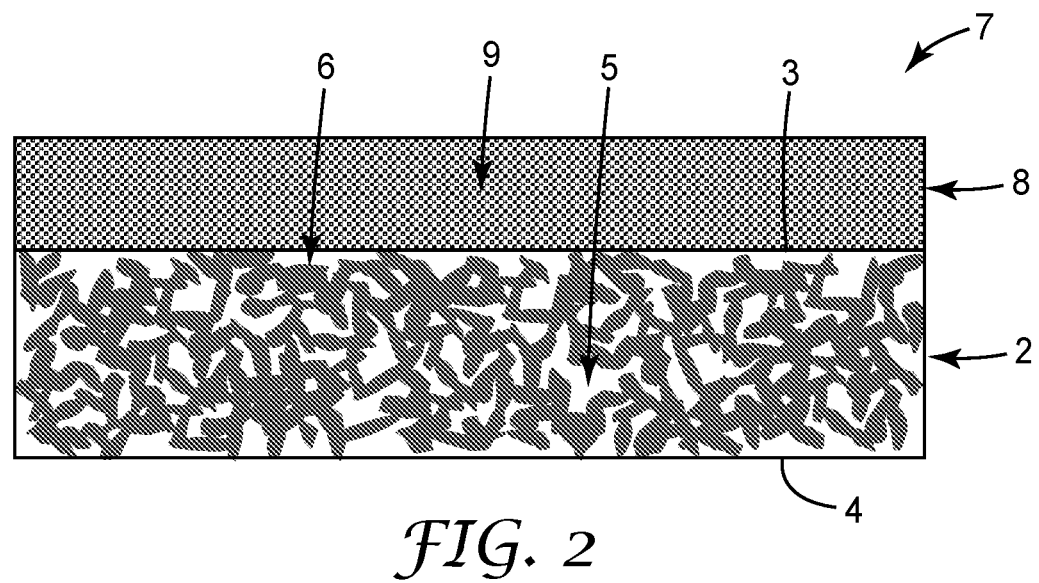
FIG. 2 is a cross-sectional representation of the polymeric film with an additional polymeric layer of the present disclosure (layers are not to scale).

As shown in FIG. 2, in certain embodiments, polymeric film 7 of the present disclosure includes a second polymeric layer 8 disposed on one major surface 3 of the first polymeric layer 2, which includes first polymer region 5. The second polymeric layer 8 includes a third polymeric material. The first polymeric material (of region 5) and the third polymeric material (of layer 8) may be the same or different. Alternatively, the third polymeric material (or layer 8) may be the same as the second polymeric material within the network of interconnected pores and channels 6.

If the second material includes air, the intermixing network of the first and second materials forms a porous structure. The second polymeric layer 8 (FIG. 2) forms a capping layer, wherein the third polymeric material of the capping layer is not penetrated into or only partially penetrated into a portion of the porous structure. In certain embodiments, the third polymeric material includes an organic polymer selected from the group of an acrylate, a polyolefin, a polyurethane, a silicone, a polyester, and a combination thereof.

In certain embodiments the first and third polymeric materials are different such that $n_1$ is different than $n_3$. In certain embodiments, $n_1$ is at least 0.05 unit different than $n_3$. In certain embodiments, $n_1$ is at most 0.5 unit different than $n_3$, In certain embodiments, $n_1$ is within 0.5 unit of $n_3$, $n_1$ is within 0.4 unit of $n_3$, $n_1$ is within 0.3 unit of $n_3$, $n_1$ is within 0.2 unit of $n_3$, or $n_1$ is within 0.1 unit of $n_3$. In this context "within" means within 0.5 unit (or 0.4 unit, or 0.3 unit, or 0.2 unit, or 0.1 unit) higher or lower.

In certain embodiments, at least one of the second or third polymeric materials is an adhesive material. In certain embodiments, each of the second and third polymeric materials is an adhesive material.

In certain embodiments, the first (possibly only) polymeric material of the polymeric film has a thickness of at least 500 nanometers micrometers (microns or μm). In certain embodiments, the first (possibly only) polymeric layer of the polymeric film has a thickness of up to up to 25 microns, or up to 15 microns, or up to 5 microns, or up to 1 microns.

In certain embodiments, the second polymeric material can fill partially the pores and channels within the first material, or completely fill the pores and channels within the first material and optionally have excess second polymeric layer on top of the filled intermixing layer (layer 2, FIG. 2). There is no maximum thickness to this excess second polymeric layer (e.g., layer 8, FIG. 2), although, in certain embodiments, it may be up to 1 millimeter (mm) thick.

In certain embodiments, the overall polymeric film has a thickness of at least 1 micron. In certain embodiments, the overall polymeric film has a thickness of up to 15 microns, up to 25 microns, up to 50 microns, or even over 100 microns.

A polymeric film of the present disclosure has the following characteristics: a clarity of at least 80% (preferably at least 85%, or more preferably at least 90%); a visible light transmission of at least 85% (preferably at least 90%); a bulk haze of 15% to 80% (preferably 20% to 80%, more preferably 30% to 70%, and even more preferably 30% to 50%). In certain embodiments, a polymeric film of the present disclosure has a normalized micro-haze non-uniformity of not more than 12% (preferably less than 10%, or more preferably less than 8%) across the polymeric film.

Accordingly, such films can be used in display devices, particularly devices that include an organic light-emitting diode display panel. They can function as very moderate optical diffusers with controlled local uniformity. The clarity, transmission, and bulk haze can be measured using a Haze Gard Plus (from BYK Gardner, Columbia, Md.), which reports measurements from a sampling beam of 18 millimeters (mm) aperture of the polymeric film, as described in the Examples Section.

The visually perceived quality of a pixelated display requires a particular uniformity of the controlled haze for spatial distributions on the order of the length scale of the display pixels. Non-uniformity of the haze above the order of length scale of the display pixels can lead to optical defects such as pixel blur or so-called sparkle. This quality is measureable by means of a micro-haze uniformity measurement (Optical Property Test Method: Micro-Haze Uniformity described in the Examples Section), which provides measurements from a sampling beam illuminating a few tens of microns of the sample. In this measurement, the polymeric film surface is scanned with an optical probe that has sub-pixel dimensions while measuring standard deviation in the measured micro-haze levels. This micro-haze measurement technique allows sample analysis for spatial frequencies corresponding to the peak for human vision perception—namely, spatial frequencies in the range of 1-5 line pairs per millimeter for typical viewing distances. The micro-haze measurements allow the examination of size scale variations on the size scale for display pixel dimensions. In contrast, conventional haze measurement systems analyze a large area of the optical film for each measurement and are unable to distinguish visually perceived differences on the critical length scales for pixelated displays.

The polymeric films of the present disclosure can significantly improve the known problem of color variation with viewing angle for OLED displays. This problem is commonly labelled off-angle color shift, or angular color non-uniformity, and the solution to the problem described herein is referred to as Wide View Color (WVC) correction. Thus, the polymeric films of the present disclosure are referred to herein as Wide View Color (WVC) correction films or WVC correction polymeric films.

A WVC correction polymeric film not only significantly improves angular color uniformity, it is compatible with a circular polarizer, maintains brightness and viewing angle, and does not noticeably introduce visual defects, such as commonly known pixel blur or localized scattering anomalies (known as "sparkle"). The pixel blur for said polymeric films is only slightly visible under a microscope, with negligible light blurred into the neighboring pixels, so the visual appearance of the display pixels is essentially maintained.

Significantly, the polymeric films control light diffusion and significantly improve angular color uniformity of OLED displays by controlling the differences in refractive indices between the particles and the polymeric matrix, the size and loading of the particles, the thickness of the polymeric films, and the distance between the first polymeric layer of the polymeric film and display. The larger the distance between the first polymeric layer of the polymeric film and the emissive display plane, the more undesirable pixel blur increases. The smaller the pixel size, the closer the first polymeric layer of the polymeric film and display plane should be. Also, as this distance increases, the contrast ratio becomes undesirably low. Because of these two factors, the distance between the first polymeric layer of the polymeric film and emissive display plane is desirably minimized. For one example, for commercially available handheld devices having typical pixel spacing of 50 microns, the distance between the first polymeric layer of the polymeric film and emissive display plane distance should preferably be less than 150 microns. For an additional example, large display monitors having typical pixel spacing of 500 microns, the distance between the first polymeric layer of the polymeric film and emissive display plane should preferably be less than 1500 microns. In general, the distance between the first polymeric layer of the polymeric film and emissive display plane is desirably less than 3 times the pixel spacing dimension of the display. Smaller first polymeric layer to display plane distances are even more preferable. In some embodiments, the distance between the first polymeric layer of the polymeric film and emissive display plane is desirably less than 2 times the pixel spacing dimension of the display. In other embodiments, the distance between the first polymeric layer of the polymeric film and emissive display plane is desirably less than the pixel spacing dimension for the display. The polymeric films do not significantly affect major performance characteristics, including brightness, circular polarizer compatibility, and view angle. Also, importantly, the pixel blur can be significantly reduced.

Polymeric Materials

A wide variety of polymers may be used in the polymeric materials of the polymeric films of the present disclosure. Exemplary polymers for use in the polymeric materials include silicones, acrylates, polyurethanes, polyesters, and polyolefins.

In certain embodiments, the polymeric materials can be selected from a single-phase polymer or a polymer having a multiphase morphology. The multiphase morphology may be inherent in the choice of polymer matrix, such as for example, in a semi-crystalline polymer having both amorphous and crystalline domains, or may result from a polymer blend. Alternatively, the multiphase morphology may develop during drying or curing of the polymer matrix. Useful polymer matrices having multiphase morphology include those where each of the phases has the same refractive index or those where the refractive index is mismatched but the domain size of the dispersed phase does not exceed the size of the particles dispersed in the polymer matrix.

In certain embodiments, the polymeric materials are adhesive materials. In certain embodiments, at least one adhesive material includes an optically clear adhesive (OCA). In certain embodiments, the optically clear adhesive is selected from an acrylate, a polyurethane, a polyolefin (such as a polyisobutylene (PIB)), a silicone, or a combination thereof. Illustrative OCAs include those described in International Pub. No. WO 2008/128073 (3M Innovative Property Co.) relating to antistatic optically clear pressure sensitive adhesives and WO 2009/089137 (Sherman et al.) relating to stretch releasing OCA, U.S. Pat. App. Pub. Nos. US 2009/0087629 (Everaerts et al.) relating to indium tin oxide compatible OCA, US 2010/0028564 (Cheng et al.) relating to antistatic optical constructions having optically transmissive adhesive, US 2010/0040842 (Everaerts et al.) relating to adhesives compatible with corrosion sensitive layers, US 2011/0126968 (Dolezal et al.) relating to optically clear stretch release adhesive tape, and U.S. Pat. No. 8,557,378 (Yamanaka et al.) relating to stretch release adhesive tapes. Suitable OCAs include acrylic optically clear pressure sensitive adhesives such as, for example, 3M OCA 8146 available from 3M Company, St. Paul, Minn.

In certain embodiments, a dual layer product construction (see, e.g., FIG. 2) may include one layer (layer 2 in FIG. 2) having particular optically diffusing properties and a second layer (layer 8 in FIG. 2) being an optically clear adhesive. Some of the benefits for forming a dual layer product construction would be to provide improved adhesive properties such as peel strength, robustness, coating integrity, etc. In cases where the dual layer product is incorporated into an OLED display device, the optically diffuse layer (layer 2 of the two layer system in FIG. 2) is preferably facing an OLED emissive display plane (e.g., the active-matrix organic light-emitting diode panel 10 in FIG. 3) and placed as close to that plane as the construction allows. For best performance, including contrast ratio and minimization of pixel blur, etc., the optically diffuse layer would be preferably in direct contact with an OLED encapsulation layer(s) (e.g., a combination of a barrier film 14 disposed on a first adhesive film 12 in FIG. 3). If not in direct contact, the performance may be degraded as the distance between the diffuse layer and emissive plane increases.

Display Devices

In certain embodiments, display devices of the present disclosure include: an organic light emitting diode panel having a multi-layer construction including one or more adhesive films; and a polymeric film as described herein incorporated within the multi-layer construction of the organic light emitting diode panel. In this context, in certain embodiments, "incorporated within the multi-layer construction" means that the polymeric film of the present disclosure replaces one or more adhesive films (e.g., optically clear adhesive films) of the multi-layer construction, particularly if the polymeric film includes an adhesive matrix. In this context, in certain embodiments, "incorporated within the multi-layer construction" means that the polymeric film of the present disclosure is incorporated into one or more adhesive films (e.g., optically clear adhesive films) of the multi-layer construction, particularly if the polymeric film itself does not include an adhesive matrix.

In certain embodiments, display devices include: an organic light emitting diode panel having a multi-layer construction including one or more adhesive films; and a polymeric film incorporated within the multi-layer construction of the organic light emitting diode panel. In such embodiments, the polymeric film includes a first polymeric layer having two major surfaces, wherein the first polymeric layer includes: a first polymer region including a first material having a refractive index of $n_1$; a second region comprising a network of interconnected pores and channels within the first polymer region; wherein the channels comprise a second material having a refractive index of $n_2$; wherein $n_1$ is different than $n_2$.

In such embodiments, $n_1$ is different than $n_2$. In some embodiments, $n_1$ is at least 0.01 unit different than $n_2$. In some embodiments, $n_1$ is at least 0.02 unit, or at least 0.03 unit, or at least 0.04 unit, or at least 0.05 unit, or at least 0.1 unit, different than $n_2$. In some embodiments, $n_1$ is at most 0.5 unit different than $n_2$. In some embodiments, $n_1$ is within 0.5 unit of $n_2$, $n_1$ is within 0.4 unit of $n_2$, $n_1$ is within 0.3 unit of $n_2$, $n_1$ is within 0.2 unit of $n_2$, or $n_1$ is within 0.1 unit of $n_2$. In this context "within" means within 0.5 unit (or 0.4 unit, or 0.3 unit, or 0.2 unit, or 0.1 unit) higher or lower.

Significantly, in certain embodiments, a display device that includes a polymeric film of the present disclosure has an off-axis color shift (0-45°) that is at least 5% better (or at least 10% better, or at least 20% better, or at least 30% better) than an off-axis color shift compared to a display device that includes a non-diffusive optically clear adhesive in place of the polymeric film. In certain embodiments, a display device that includes a polymeric film of the present disclosure has an off-axis color shift (0-60°) that is at least 5% better (or at least 10% better, or at least 20% better, or at least 30% better) than an off-axis color shift compared to a display device that includes a non-diffusive optically clear adhesive in place of the polymeric film. In this context, a "non-diffusive" optically clear adhesive refers to an adhesive that is free of any light scattering particles or domains. Such an adhesive typically has a bulk haze of less than 0.5%.

Display devices of the present disclosure may be flexible or rigid. Examples of OLED displays that could incorporate the polymeric films of the present disclosure are described in U.S. Pat. Pub. Nos. US 2016/0001521 (Tanaka et al.), US 2014/0299844 (You et al.), and US 2016/0155967 (Lee et al.).

Figure 3:
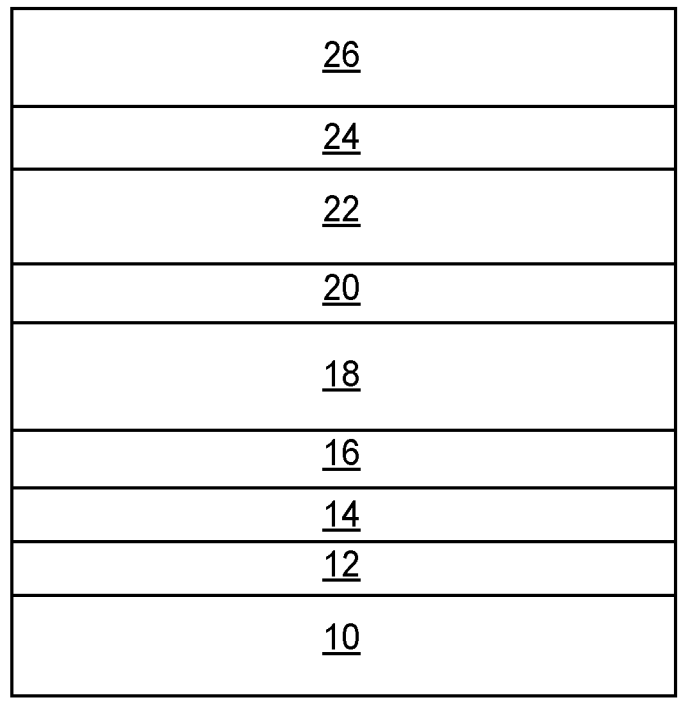
FIG. 3 is a cross-sectional representation of an organic light emitting diode panel having a multi-layered construction (layers are not to scale).

Exemplary devices include an organic light emitting diode panel having a multi-layered construction that includes, as shown in FIG. 3, an active-matrix organic light-emitting diode (AMOLED) panel 10; a first adhesive film 12 disposed on the active-matrix organic light-emitting diode panel 10; a barrier film 14 disposed on the first adhesive film 12; a second adhesive film 16 disposed on the barrier film 14; a circular polarizer 18 disposed on the second adhesive film 16; a third adhesive film 20 disposed on the circular polarizer 18; a touch panel 22 disposed on the third adhesive film 20; a fourth adhesive film 24 disposed on the touch panel 22; and a cover window 26 disposed on the fourth adhesive film 24. In certain embodiments, first adhesive film 12 includes an adhesive with good barrier properties like polyisobutylene. In certain embodiments, barrier film 14 is a conventional inorganic/organic multi-layer barrier film.

The display device of FIG. 3 is exemplary only of various multi-layered constructions. In certain embodiments, for example, barrier film 14 is incorporated into the AMOLED panel 10. In certain embodiments, first adhesive film 12 and barrier film 14 combined form a barrier against moisture and oxygen. In certain embodiments, touch panel 22 is incorporated into the AMOLED panel 10.

In certain multi-layer constructions, a polymeric film of the present disclosure includes at least one adhesive matrix. In such embodiments, such polymeric film can be the first adhesive film 12 (FIG. 3). In certain multi-layer constructions, a polymeric film of the present disclosure does not include an adhesive matrix. In such embodiments, such polymeric film can be incorporated within the first adhesive film 12 (FIG. 3).

In certain embodiments, the second, third, and/or fourth adhesive films (16, 20, 24 of FIG. 3) include (or is replaced by) a polymeric film of the present disclosure. In certain embodiments, the third and/or fourth adhesive films (20, 24 of FIG. 3) include (or is replaced by) a polymeric film of the present disclosure.

The adhesive films of the multi-layer construction shown in FIG. 3 that do not include a polymeric film include an optically clear adhesive as described above. In certain embodiments, first adhesive film 12 would typically have some barrier properties against moisture and oxygen.

Figure 4:
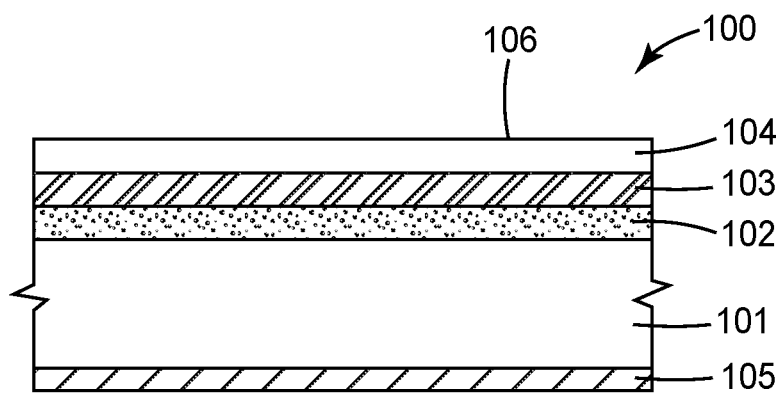
FIG. 4 is a cross-sectional representation of an exemplary active-matrix organic light-emitting diode panel (AMOLED panel).

In certain embodiments, the active-matrix organic light-emitting diode panel (10 of FIG. 3) includes an organic electroluminescent layer. For example, an exemplary active-matrix organic light-emitting diode panel (AMOLED panel) is shown in FIG. 4, and includes a driving substrate 101 in which a driving device array (e.g., a thin-film transistor (TFT) array) is arranged, an organic electroluminescent layer 102, a cathode electrode layer 103, and an encapsulation layer 104. A color filter layer (not shown) may be further arranged between the organic electroluminescent layer 102 and the encapsulation layer 104. A reflective layer 105 for reflecting light toward the encapsulation layer 104, that is, toward a light-emitting surface 106, may be provided under the driving substrate 101. Because the AMOLED panel is a self-emissive display panel in which the organic electroluminescent layer 102 generates light by using a driving signal, a separate light source (e.g., a backlight) may not be necessary.

In certain embodiments, a barrier film (14 of FIG. 3) includes an optical substrate such as COP (cyclic olefin polymer) or PET (polyethylene terephthalate) coated with alternating layers of organic/inorganic materials that form an oxygen and moisture barrier. Examples of inorganic materials include silica, alumina, silicon carbide, and silicon nitride. An example includes a cured tricyclodecane dimethanol diacrylate and silica alternating layers). The organic layers are typically highly crosslinked acrylic materials.

Figure 5:
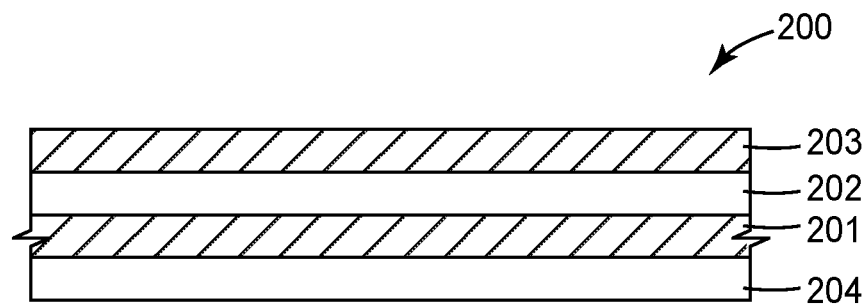
FIG. 5 is a cross-sectional representation of a circular polarizer according to an exemplary embodiment of the present disclosure.

An exemplary circular polarizer (18 of FIG. 3) is shown in FIG. 5, which is a cross-sectional view of the circular polarizer 200 according to an exemplary embodiment. Referring to FIG. 3, the circular polarizer 200 may include a linear polarizer 202, an upper support plate 203 and a lower support plate 201 that support the linear polarizer 202, and a quarter wave ($\lambda/4$) phase plate 204. The linear polarizer 202 may be, for example, a polyvinyl alcohol (PVA) film. The upper support plate 203 and the lower support plate 201 may be, for example, tri-acetyl-cellulose (TAC) films. The $\lambda/4$ phase plate 204 may be adhered to the lower support plate 201 by using an OCA layer. Exemplary embodiments are not limited to these types. The linear polarizer 202 linearly polarizes the external light L1. The $\lambda/4$ phase plate 204 circularly polarizes linearly polarized light and linearly polarizes circularly polarized light.

Figure 6:
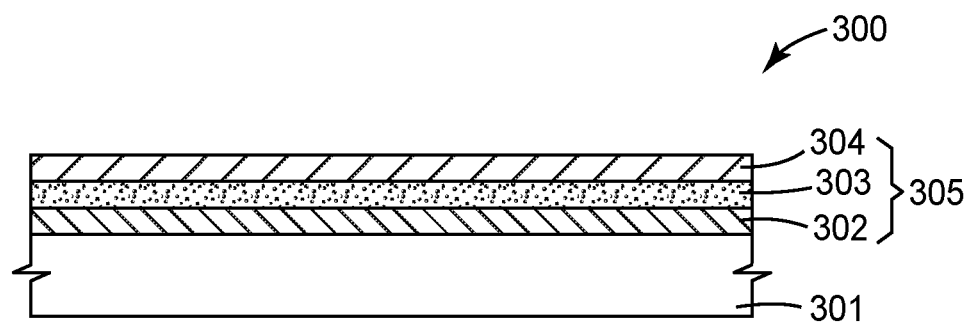
FIG. 6 is a cross-sectional representation of a capacitive touch panel according to an exemplary embodiment of the present disclosure.

In certain embodiments, a touch panel (22 of FIG. 3) includes a base substrate configured to transmit light and a touch electrode layer configured to receive a touch input. For example, FIG. 6 is a cross-sectional view of the touch panel 300 that is a capacitive touch panel according to an exemplary embodiment. The touch panel 300 is a manipulation unit that receives a user input. Resistive touch panels or capacitive touch panels are used in mobile devices. Referring to FIG. 6, the touch panel 300 may include a base substrate 301 that is a light-transmitting base substrate and a touch electrode layer 305 that is a light-transmitting touch electrode layer. The touch electrode layer 305 may include first and second electrode layers 302 and 304, and a dielectric layer 303 that is disposed between the first and second electrode layers 302 and 304.

The first electrode layer 302 may be formed by forming as a patterned thin film a conductive metal such as indium tin oxide (ITO), copper metal mesh, or silver nanowires on the base substrate 301 by using vacuum deposition, sputtering, or plating, etc. The dielectric layer 303 may be formed on the first electrode layer 302, and the second electrode layer 304 may be formed by forming as a patterned thin film a conductive metal on the dielectric layer 303 by using vacuum deposition, sputtering, or plating, etc. For example, the first electrode layer 302 may include a plurality of horizontal electrodes, and the second electrode layer 304 may include a plurality of vertical electrodes. Touch cells are formed at intersections between the horizontal electrodes and the vertical electrodes. The horizontal electrodes may be, for example, driving electrodes, and the vertical electrodes may be, for example, receiving electrodes. When a touching object, for example, a user's hand or a touch pen (e.g., stylus) approaches or contacts the touch panel 300, a change in a capacitance of a touch cell occurs. When a touch event occurs, a position of the touch cell may be detected by detecting the change in the capacitance. Also, the touch panel 300 may be formed so that the first and second electrode layers 302 and 304 are formed on a top surface and a bottom surface of the base substrate 301, respectively. Also, the touch panel 300 may be formed so that two substrates on which electrode layers are formed are bonded to each other. The touch panel 300 may be manufactured as a pliable light-transmitting film.

In certain embodiments, a cover window (26 of FIG. 3) includes a curved portion and/or a flat portion. The cover window may be made of a material selected from glass or an optically clear plastic. The cover window may allow an image that is displayed on the OLED panel to be seen therethrough, and may protect the OLED panel from external shock. Thus, the cover window is made of one or more transparent materials. The cover window may be formed of a rigid material, e.g., glass or plastics such as a polycarbonate or a polymethylmethacrylate. The cover window may be formed of a flexible material, e.g., plastics such as a polycarbonate or a polymethylmethacrylate.

Exemplary Embodiments

Embodiment 1 is a display device that includes: an organic light emitting diode panel having a multilayer construction including one or more adhesive films; and a polymeric film incorporated within the multilayer construction of the organic light emitting diode panel. The polymeric film includes: a first polymeric layer having two major surfaces. The first polymeric layer includes: a first polymer region including a first material having a refractive index of $n_1$; a second region comprising a network of interconnected pores and channels within the first polymer region; wherein the second region includes a second material having a refractive index of $n_2$; and wherein $n_1$ is different than $n_2$. The first material includes a first elastic polymeric material and optional particles. The second material includes: a second polymeric material and optional particles; and/or air. The polymeric film has: a clarity of at least 90%; a visible light transmission of at least 80%; and a bulk haze of 25% to 80%.

Embodiment 2 is the display device of embodiment 1 wherein the polymeric film has a normalized micro-haze non-uniformity of not more than 12% across the polymeric film.

Embodiment 3 is the display device of embodiment 1 or 2 wherein the polymeric film has a thickness of at least 1 micron.

Embodiment 4 is the display device of any one of embodiments 1 through 3 wherein the polymeric film has a thickness of up to 50 microns.

Embodiment 5 is the display device of any one of embodiments 1 through 4 wherein the difference between $n_1$ and $n_2$ is at least 0.01 unit.

Embodiment 6 is the display device of any one of embodiments 1 through 5 wherein the first elastic polymeric material is present in amount of at least 35 vol-%, based on the total volume of the polymeric film.

Embodiment 7 is the display device of any one of embodiments 1 through 6 wherein the first elastic polymeric material is present in amount of up to 90 vol-%, based on the total volume of the polymeric film.

Embodiment 8 is the display device of any one of embodiments 1 through 7 wherein the first elastic polymeric material is a cured product of multifunctional monomers, oligomers, and optional surface modified nanoparticles Embodiment 9 is the display device of any one of embodiments 1 through 8 wherein the second material is a polymeric material.

Embodiment 10 is the display device of embodiment 9 wherein the second polymeric material is present in the amount of at least 10 vol-%, based on the total volume of the polymeric film.

Embodiment 11 is the display device of embodiment 9 or 10 wherein the second polymeric material is present in the amount of up to 65 vol-%, based on the total volume of the polymeric film.

Embodiment 12 is the display device of any one of embodiments 9 through 11 wherein the second polymeric material comprises an organic polymer selected from the group of an acrylate, a polyolefin, a polyurethane, a silicone, a polyester, and a combination thereof.

Embodiment 13 is the display device of any one of embodiments 9 through 12 wherein the second material comprises particles.

Embodiment 14 is the display device of any one of embodiments 1 through 13 wherein the first material comprises particles.

Embodiment 15 is the display device of embodiment 13 or 14 wherein the particles comprise inorganic nanoparticles.

Embodiment 16 is the display device of embodiment 15 wherein the inorganic particles are selected from the group of $ZrO_2$, $SiO_2$, $TiO_2$, $SnO_2$, and combinations thereof.

Embodiment 17 is the display device of any one of embodiments 1 through 8 wherein the second material comprises air.

Embodiment 18 is the display device of any one of embodiments 1 through 17 comprising a volume fraction of the second region comprising a network of interconnected pores and channels is at least 10%.

Embodiment 19 is the display device of any one of embodiments 1 through 18 wherein the network of interconnected pores and channels possesses angular-averaged scattering properties that are similar to a scattering particle of less than 2 microns in size.

Embodiment 20 is the display device of any one of embodiments 1 through 19 wherein the polymeric film further comprises a second polymeric layer disposed on one or both major surface(s) of the first polymeric layer; wherein the second polymeric layer comprises a third polymeric material having a refractive index $n_3$; wherein the first polymeric material and the third polymeric material are the same or different.

Embodiment 21 is the display device of embodiment 20 wherein the second polymeric material and/or third polymeric material is an adhesive.

Embodiment 22 is the display device of embodiment 21 wherein the adhesive is an optically clear adhesive.

Embodiment 23 is the display device of any one of embodiments 19 through 22 wherein the first and second materials form a porous structure, and the second polymeric layer is a capping layer, wherein the capping layer is not penetrated or only partially penetrated into a portion of the porous structure.

Embodiment 24 is the display device of embodiment 23 wherein the capping layer comprises a third polymeric material that is the same as the first non-adhesive polymeric material.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

Materials

TABLE 1

| Designation | Description | Source |
|---|---|---|
| PH-56 | Polyester Polyol Mw = 2000, under trade designation STEPANPOL PH-56 | Stepan Company, Northfield, IL |
| ACM | Acrylamide | Parchem, New Rochelle, NY |
| HDI | Hexamethylene diisocyanate, under the trade name DESMODUR H | Bayer Materials Science LLC, Pittsburgh, PA |
| MEK | Methyl ethyl ketone, solvent | Avantor Performance Materials, Inc Center Valley, PA |
| DBTDA | Dibutyltin diacetate | Sigma-Aldrich, St. Louis, MO |
| DMPA | 2,2-Bis(hydroxymethyl)propionic acid | Sigma-Aldrich, St. Louis, MO |
| BAGM | bisphenol A-glycidyl methacrylate | Sigma-Aldrich, St. Louis, MO |
| CN104 | Epoxy acrylate oligomer | Sartomer, Exton, PA |
| SR238 | 1,6 hexanediol diacrylate | Sartomer, Exton, PA |
| SR444 | pentaerythritol triacrylate | Sartomer, Exton, PA |
| RF02N | Silicone coated polyester release liner | SKC Haas (Cheonan, Korea) |
| RF52N | Silicone coated polyester release liner | SKC Haas (Cheonan, Korea) |
| TPO | 2,4,6 trimethyl benzoyl-triphenyl oxide | BASF, Florham Park, NJ |
| HR6100 | Modified bisphenol fluorene diacrylate | Miwon speciality Chemical Co., Ltd. Korea |
| M1192 | Biphenylmethyl Acrylate | Miwon speciality Chemical Co., Ltd. Korea |
| IRGACURE 184 | 1-Hydroxycyclohexyl-1-phenyl methanone | BASF, Florham Park, NJ |
| IRGACURE 819 | Phosphine oxide, phenyl bis (2,4,6-trimethyl benzoyl) | BASF, Florham Park, NJ |
| Silquest A-174 | 3-Mercaptopropyltrimethoxysilane, available under the trade designation "SIM6476.0" | Gelest Inc, Morrisville, Pennsylvania. |
| MP4540M | Colloidal Silica dispersion | Nissan Chemical, Houston |
| $ZrO_2$-Sol | Zirconium oxide dispersion with an average particle size of 8 nm. | Prepared by the procedures disclosed in U.S. Pat. No. 7,241,437, Example 6. |

Test Methods

Optical Property Test Methods: Bulk Haze, Transmission, Clarity and Refractive Index Basic optical properties including transmission, bulk haze, and clarity values were measured using a Haze-Guard Plus haze meter (commercially available from BYK-Gardner, Columbia, Md.). Refractive indices of these films were measured using a Metricon Model 2010 Prism Coupler (available from Metricon Corp., Pennington, N.J.). This instrument samples the optical film with rather large area beam (18 millimeter (mm) diameter) to average over considerable area of display surface.

Optical Property Test Method: Micro-Haze Uniformity

Haze can be measured on a small lateral scale by focusing a probe beam onto the surface of the sample such that the focused spot is, for example, on the order of 10 micrometers or less. This approach of interrogating a small area of the sample is referred to herein as micro-haze. The micro-haze measurement technique allows sample analysis for spatial frequencies corresponding to the peak for human vision perception and on the length scale of the display pixels. Standard haze measurement systems analyze a large area of the optical film and do not show differences on the critical length scales for pixelated displays.

Figure 7:
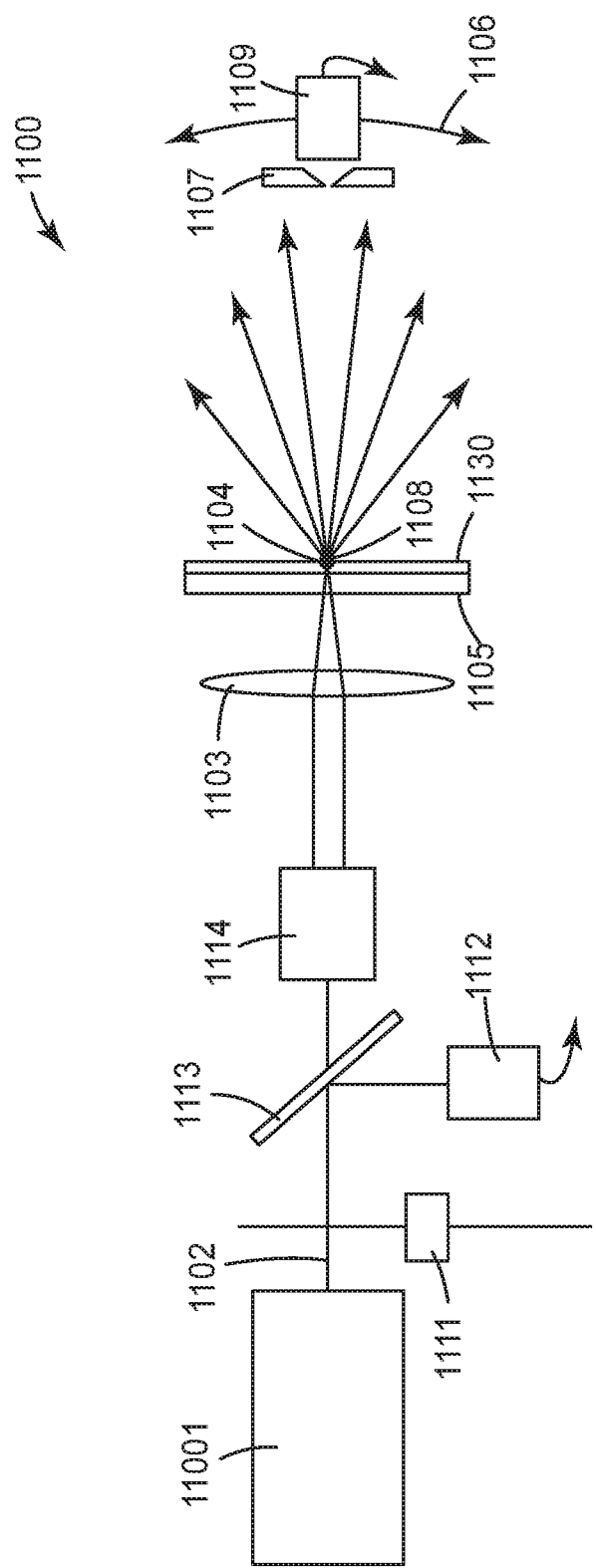
FIG. 7 is a representation of a microscatterometry system used to determine the micro-haze of polymeric optical films.

The microscatterometry system used to determine the micro-haze of polymeric optical films is shown in FIG. 7. Referring to FIG. 7, microscatterometry system 1100 included laser light source 1101 (obtained from Melles Griot, Carlsbad, Calif., as Model 85-GCB-020, 532 nm 20 mW DPSS laser), optical chopper (for chopping the light beam) 1111 (obtained under the trade designation "NEW FOCUS 3501 OPTICAL CHOPPER" from Newport Corporation, Irvine, Calif.), light beam splitter 1113 (obtained under the trade designation "UV FUSED SILICA METALLIC NEUTRAL DENSITY FILTER FQR-ND01" from Newport Corporation), second light detector 1112 (obtained under the trade designation "NEW FOCUS LARGE-AREA PHOTORECEIVER," Model 2031, from Newport Corporation), beam expanding spatial filter (filtering and expanding the light beam) 1114 (obtained under the trade designation "COMPACT FIVE-AXIS SPATIAL FILTER MODEL 910A" from Newport Corporation used with collimating lens achromatic doublet (1 inch diameter, 50.8 mm focal length) obtained under the under the trade designation "PAC040" from Newport Corporation), focusing lens 1103 (obtained under the trade designation "PAC058 ACHROMATIC DOUBLET" (1 inch diameter, 150 mm focal length from Newport Corporation)), sample holder 1105 (a spring loaded mount (obtained under the trade designation "M-PPF50" from Newport Corporation)), sample to be tested 1130, variable aperture 1107 (obtained under the trade designation "COMPACT ADJUSTABLE WIDTH SLIT M-SV-0.5" from Newport Corporation), first light detector 1109 (obtained under the trade designation "NEW FOCUS LARGE-AREA PHOTO RECEIVER," Model 2031, from Newport Corporation) rotatable (1106) from at least −90° to 90° about eucentric point 1108 in a plane parallel to the ground, and −45° to 45° about the same eucentric point 1108 in an orthogonal plane.

Other components of the microscatterometry system included a linear translation stage (obtained under the trade designation "MFA-1C" from Newport Corporation), detector stages (obtained under the trade designation "ROTATION STAGE RV350PE" from Newport Corporation), goniometric stage (obtained under the trade designation "GONIOMETRIC STAGE BGM 160 PE" from Newport Corporation), stage drivers (for sample and detector stages (obtained under the trade designation "UNIVERSAL MOTION CONTROLLER ESP300" from Newport Corporation)), and detection electronics (obtained under the trade designation "ANALOG-TO-DIGITAL CONVERTER NI 9215, CDAQ 9172 CHASSIS" from National Instruments, Austin, Tex.).

When light source 1101 was energized, light beam 1102 passed through and was focused by focusing lens 1103 to a spot having a 10-micrometer spot diameter focused at eucentric point 1108. The focused light diverged after focal point 1104. The diverging light passed through aperture 1107 before contacting first light detector 1109. Sample holder 1105 translated in a plane orthogonal to the incident light beam 1102. Light beam splitter 1113 was used to split light beam 1102 to second light detector 1112. Light beam splitter 1113 transmitted about 90% of light beam 1102 towards focusing element 1103 and reflected about 10% of light beam 1102 towards second detector 1112. Second detector 1112 was used to monitor variations in the intensity of light beam 1102 coming from light source 1101. The signal from first detector 1109 was divided by the signal from second detector 1112, to account for variations in the intensity of light beam 1102.

During operation sample holder 1105 translated such that a portion of sample holder 1105 remained at eucentric point 1108, and rotated about eucentric point 1108.

During operation, first light detector 1109 rotated (1106) about eucentric point 1108 and collected data generated by the scattered light passing through aperture 1107 onto first light detector 1109.

A probe wavelength of 532 nanometers (nm) was used to obtain the approximately 10-micrometer focused spot diameter by using a 154-mm focal length lens using the diameter of an Airy disc (spot diameter=2.44×wavelength×focal length/beam diameter).

The sample was physically scanned relative to the focused spot to take measurements across the film surface and gather statistics for micro-haze uniformity. For each angular position of the first light detector with respect to the in-line direction, the light transmitted through the sample was measured as a function of position across the sample. The measurement at each lateral position took 1 second. In this way, the angular spectrum of scattered light was obtained for each lateral position of interest on the sample. The angle subtended by the first light detector at each angular measurement position was 0.2° in the measurement plane and 0.85° normal to the measurement plane. From these angular scatter light intensities the light intensity proportional to the direct beam (the beam diverging from the focused spot with the same angle as the convergence angle of the original incident beam) and the light intensity proportional to the scattered beam are calculated. The direct beam measurement included light between 0° and 5.8° (the angle between the optic axis and the edge of the direct beam, determined by measuring the beam with no sample in place). The scattered beam measurement included the light projecting between 5.8° to 15.8° (representative of light scattered out of the direct beam into the first 10° adjacent to the direct beam). From these two values the fractional micro-haze was calculated. This is defined as the ratio of scattered beam intensity to the sum of scattered plus transmitted direct beam. Normalizing in this way negates the effects of absorption and front surface reflections from the micro-haze calculation.

During the measurement, the beam was physically chopped at around 2.04 kHz and both the detected signal and the source laser intensity were measured with a lock-in amplifier. This chopping frequency was in the low noise and flat frequency response range of the photodetectors. Lock-in detection enabled intensity measurements over more than 4 orders of magnitude, which is helpful when making measurements of low haze samples, where there is a large difference in the intensities of the direct beam and scattered beam. The micro-haze uniformity is defined as the standard deviation of the fractional micro-haze divided by the mean fractional micro-haze measurement itself. In this way, the micro-haze uniformity metric is functionally a noise-to-signal ratio.

OLED Color Shift Test Method

Figure 8:
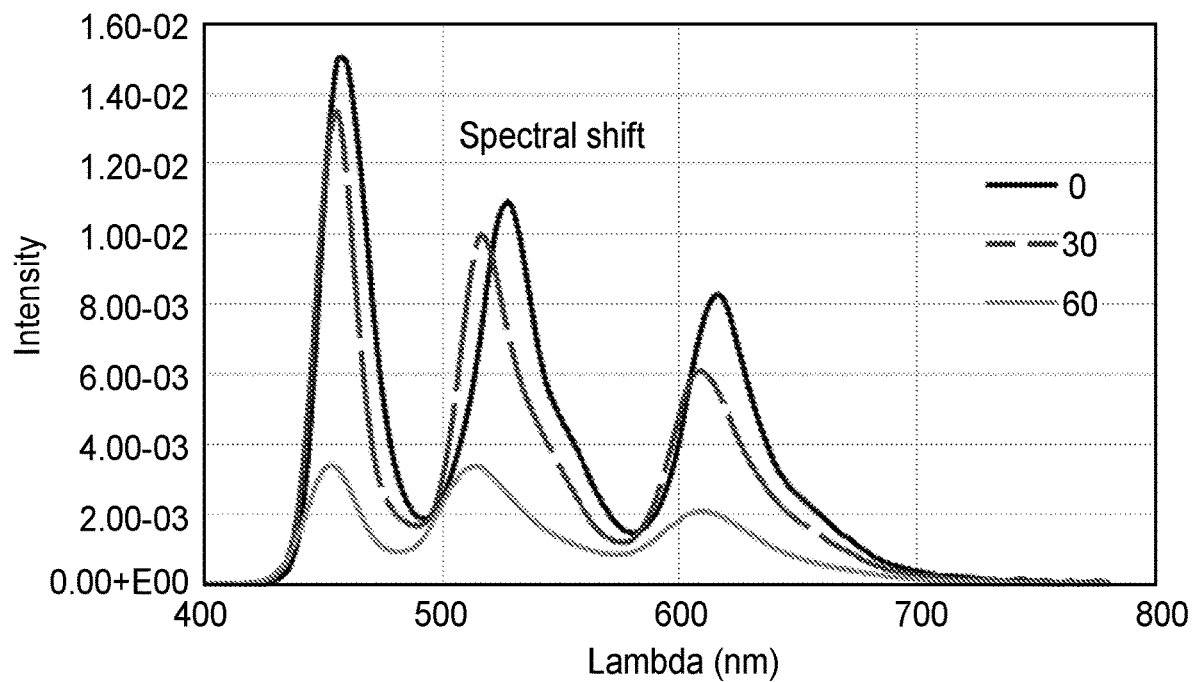
FIG. 8 is an optical spectrum of an exemplary film of the present disclosure for 3 different viewing angles.

The angular color of a strong-cavity OLED device, commonly used in mobile phones, has a blue shift as the viewing angle increases. This effect is commonly referred to as off-angle color shift or angular color non-uniformity. The optical spectrum at three (3) selected viewing angles of a Samsung S5 mobile phone is illustrated in FIG. 8. The spectrum shows three (3) spectral peaks. Although the overall spectrum demonstrates a clear trend of shifting to shorter wavelength as the viewing angle increases, many other spectral parameters also vary—the spectral weights of the three distinct peaks change and the relative shift of each spectral peaks are different from each other.

As a figure of merit for the off-angle color shift, it is common to represent the color shift from the corresponding shift in CIE (Commission on Illumination) color coordinates. The CIE color coordinates (u,v) are measures for differing angles and the metric for color shift can be represented by delta_u'v' as expressed in equation A.

$$\text{delta}\_u'v' = \{[u'(\theta) - u'(0)]^2 + [v'(\theta) - v'(0)]^2\}^{0.5};\quad \text{(A)}$$

The sample measurement method for OLED color shift utilized a Samsung S5 OLED mobile phone; the same Samsung S5 was used as the testbed for each of the diffuse adhesive samples in the comparison. One intended use of the moderately diffusing polymeric film is to incorporate into the OLED layers, preferably directly above the OLED pixels or above the TFE layer (thin film encapsulation). For this test, however, it is considered equivalent to measure color shifts and brightness with the polymeric film samples placed proximate but outside of the OLED device assembly. More specifically, samples were placed immediately above the touch panel display.

After mounting the samples onto the OLED device assembly, a blank white image was then displayed on the OLED screen. Next, the OLED panel assembly was mounted on a rotation stage to enable angular adjustment relative to the measuring spectrophotometer. For this test system, a PR650 spectrophotometer (PhotoResearch Inc., Syracuse, N.Y.) was used to measure the color and luminance intensity of the testing assembly at every 5 degree incremental rotation angle.

For each sample in this evaluation, the angular color shift (delta_u'v') of the OLED device with a Wide View Color (WVC) correction polymeric film was plotted and compared to the same OLED without a WVC correction polymeric film (control). An exemplary plot is shown in FIG. 6. The WVC correction polymeric film helps to substantially reduce the angular color shift of the OLED device. The maximum color shift from 0-45 degrees was reduced from delta_u'v'=0.012 (control) to delta_u'v'=0.07 (with polymeric film), representing a 40% reduction.

Preparation of Component Materials for Examples
Surface Modified $ZrO_2$ Nanoparticles A 200-gram sample of $ZrO_2$ sol (33.6 wt-%) was charged to a 1-quart glass jar. 1-Methoxy-2-propanol (200 grams (g)), SILQUEST A-174 (11.67 g) and methyltrimethoxysilane (6.39 g) were charged to the jar with stirring. The jars were heated to 85 C for 4.0 hours (h).

Deionized water (500 g) and concentrated $NH_3$/water (13.0 g, at 29% $NH_3$) were charged to a 4-Liter beaker. The above dispersion was added to the beaker over about 5 minutes to obtain a white precipitate. The solids were recovered via vacuum filtration and washed with additional deionized water (2×125 g). The damp solids were dispersed in 1-methoxy-2-propanol (529 g). The resultant dispersion was concentrated via rotary evaporation to 223 g. 1-Methoxy-2-propanol (123 g) was added and the dispersion concentrated to 152.94 g. 1-Methoxy-2-propanol (96 g) was added and the dispersion concentrated to 178.76 g. A resultant translucent sol was obtained which contained 49.57 wt-% solid. These are hereafter referred to as surface modified $ZrO_2$ nanoparticles Surface Modified Silica Nanoparticles In a 500-mL flask, equipped with a condenser and a thermometer, 200 g of MP4540M colloidal solution and 200 g of 1-methoxy-2-propanol were mixed together under rapid stirring. 0.6 g of SILQUEST A-174 was then added. The mixture was heated to 80° C. for 16 hours. A 150 g sample of additional 1-methoxy-2-propanol was then added. The resulting solution was allowed to cool down to room temperature. Most of the water and 1-methoxypropanol solvents were removed using a rotary evaporator under 60° C. water-bath, resulting in 47.16 wt-% A-174 modified 440 nm silica dispersion in 1-methoxy-2-propanol. The resulting surface modified Silica nanoparticles are hereafter referred to as A-174 modified MP4540M.

Preparation of Transferable Polymer Film on Release Liner

The UA-Polymer (Polyurethane Acrylate Solution) synthesis was conducted in a resin reaction vessel equipped with a mechanical stirrer, a condenser, a thermocouple, and a nitrogen inlet. The following were added: 81.30 g hydroxyl terminated polyester PH-56 (a hydroxyl value of 57 mg KOH/g), 14.50 g DMPA, and 180.0 g of MEK. The solution was heated up to 75° C., then with stirring the following were added: 0.48 g DBTDA and 99.16 g of HDI. The temperature was further heated up to 80±2° C. until NCO content reached was theoretical NCO value, which was determined by a standard dibutylamine back titration method. Upon obtaining the theoretical NCO value, the polyurethane was then chain extended adding a mixture of 40.0 g MEK and 40.0 g bisphenol A-glycidyl methacrylate, and allowed to react until no free NCO group was observed by FT-IR. During the reaction, 70 g of additional MEK was added into the reactor to dilute the system. Finally, the clear and transparent polyurethane solution with 46% solids was obtained. The measured GPC data is shown in Table 6 (Mn=number average molecular weight; Mw=weight average molecular weight; Mp=molar mass at peak maximum; Mz=z-average molecular weight; Pd=polydispersity)

TABLE 2

|  | Mn | Mw | Mp | Mz | Pd |
| --- | --- | --- | --- | --- | --- |
| UA-Polymer | 37731 | 107873 | 55244 | 271595 | 2.859 |

In a 16-ounce brown jar, 236.8 g of UA-polymer (46 wt-% solid in MEK), 37.62 g of CN104, 1.72 g of TPO (BASF), and 312 g of MEK were added. The final mixture was put on a roller for several hours to form a 25 wt-% solid coating solution.

The coating solution was then applied to the release side of a 2-mil RF52N liner using a 20.3 cm (8 inch) slot-type die at a line speed of 5 ft/min and a flow rate of 10 cc/min. The coating was dried at 200° F., then a 2 mil RF02N liner was laminated on the coating. Finally the coating was cured through RF02N liner using a Fusion System Model 1600 (Fusion UV Systems, Gaithersburg Md.). The Model 1600 was configured with an H-bulb and operated at 100% power.

Stock Coating Solution

A stock coating solution was prepared for each of the following examples by mixing 40 g of A-174 modified MP4540M prepared above, 3.528 g of SR 238, 14.112 g of SR444, 196 g of isopropyl alcohol, 98.4 g of 1-methoxy-2-propanol, 0.022 g of Irgacure 819, 0.46 g of Irgacure 184 under stirring to form a homogenous solution at 10% solid.

PREPARATION OF EXAMPLES

Example 1: Air-Filled Porous Film

The stock coating solution was prepared as described above and then further diluted to 5 wt-% using 1:2 ratio of 1-methoxy-2-propanol/IPA. The 5 wt-% solution was syringe-pumped at a rate of 3.3 $cm^3$/min into a 10.2 cm (4-inch) wide slot-type coating die. The slot coating die uniformly distributed a 10.2 cm wide coating onto a substrate moving at 5 ft/min. The input substrate is the flexible thin releasable coating on RF52N where the RF02N was first peeled off before the coating die. For the control sample, 2 mil Mitsubishi PET film (3SAB) was used.

Next, the coating was polymerized by passing the coated substrate through a UV-LED cure chamber that included a quartz window to allow passage of UV radiation. The UV-LED bank included a rectangular array of 160 UV-LEDs, 8 down-web by 20 cross-web (approximately covering a 10.2 cm×20.4 cm area). The LEDs (available from Cree, Inc., Durham N.C.) operated at a nominal wavelength of 385 nm, and were run at 45 Volts at 3 Amps. The UV-LED array was powered and fan-cooled by a TENMA 72-6910 (42V/10 A) power supply (available from Tenma, Springboro Ohio). The UV-LEDs were positioned above the quartz window of the cure chamber at a distance of approximately 2.5 cm from the substrate. The UV-LED cure chamber was supplied with a flow of nitrogen at a flow rate of 46.7 liters/min (100 cubic feet per hour) resulting in an oxygen concentration of approximately 150 ppm in the cure chamber.

After being polymerized by the UV-LEDs, the solvent in the cured coating was removed by transporting the coated substrate to a drying oven at 200° F. for 2 minutes at a web speed of 5 ft/min. Next, the dried coating was post-cured using a Fusion System Model I300P configured with an H-bulb (available from Fusion UV Systems, Gaithersburg Md.), operated at 100% power. The UV Fusion chamber was supplied with a flow of nitrogen that resulted in an oxygen concentration of approximately 50 ppm in the chamber.

The coating results in an air-filled porous structure which is hereafter referred to as Example 1.

A control coating was also prepared without UV-LED input (0 amps), which leads to solid coating without air voids, the RI of the solid coating is measured as 1.493 using Metricon prism coupler, which represent the refractive index of the backbone of the porous coating.

Example 2: Air-Filled Porous Film

The porous coating was prepared is similar to Example 1, but it was coated at 6.6 cc/min with a moving web of 10 ft/min, and 1 Amps of UV-LED Power. In general, the result for coating with lower UV-LED exposure gives a resulting porous coating with less porosity than Example 1. The coating results in an air-filled porous structure hereafter referred to as Example 2.

Example 3: Nanoporous Coating with $ZrO_2$-Based High RI Backfill (Handspread)

Preparation of $ZrO_2$-Based High Refractive Index (RI) Backfill Solution-I:

In a glass jar, 15 g of A174/methyl modified ZrO2 nanoparticles (45.97 wt-%), 0.345 g of HR-6100 (commercially available from Miwon Chemical), 1.378 g of M1192 (commercially available from Miwon Chemical), 0.09 g of TPO (commercially available from BASF), 69.5 g of isopropyl alcohol were mixed together to form a homogenous high Refractive Index (RI) coating solution. For refractive index measurement, the high RI back fill solution was coated on PET film using No. 7 wire-round bar by hand-spread, after solvents were drying out, the coating was cured using a fusion UV system operating at 100% power under N2 with belt speed at 30 ft/min for 1 pass. The RI was measured at 1.71 at 632.8 nm using Metricon prism coupler.

For Example 3, this high Refractive Index (RI) coating solution was used to fill the nanoporous coating of Example 2. Briefly, the high RI coating solution was coated on the nanoporous coating using No. 7 wire-round bar by hand spread, and then the coating was cured using fusion UV operating at 100% power under nitrogen with belt speed at 30 ft/min for 1 pass. The resulting high RI filled nanoporous film is hereafter referred to as Example 3. For Example 3, the difference between the refractive index of the high RI backfill (1.71) and the backbone of the porous coating (1.493) is 0.217.

Example 4: Nanoporous Coating with $ZrO_2$-Based High RI Backfill (10 wt-%)

The stock coating solution was coated at 10 wt-% for Example 4. The 10% wt solutions was coated on the flexible thin coating carried on RF52N or 3SAB as described previously. The flow rate is 6.6 cm³/min and the slot coating die uniformly distributed a 10.2 cm wide coating onto a substrate moving at 10 ft/min. Next, the coating was polymerized by passing the coated substrate through a UV-LED cure chamber that included a quartz window to allow passage of UV radiation. The LEDs (available from Cree, Inc., Durham N.C.) operated at a nominal wavelength of 385 nm, and were run at 45 Volts at 1.5 Amps. After being polymerized by the UV-LEDs, the solvents are dried and the coating was post-cured the same way as Example 1 described above to result in a highly diffuse optical article with 82.5% Transmission, 93% Haze and 85.9% Clarity.

This porous coating was then over-coated with $ZrO_2$-based high RI backfill solution that differs slightly from the previous high RI solution that was applied by hand-spread for Example 3. For this example, the high RI coating solution was prepared according to the procedures and materials of Example 3 of U.S. Pat. No. 8,343,622 B2 (Liu et al). The RI of this high RI backfill made in this case was 1.69 as measured at 632.8 nm.

In order to fill the porous structure with high Refractive Index backfill solution, 15 wt-% of ZrO2-based backfill solution (described above) was syringe-pumped into a 4 inch wide slot-type coating die, and distributed to a homogenous 10.2 cm wide coating on the porous coating with a flow rate of rate of 8.2 cm³/min. For this fill coating, the porous substrate moving at 10 feet/min. The coating solution was dried after two 5 yard long oven set-up at 190 F. Next, the dried coating was post-cured using a Fusion System Model I300P configured with an H-bulb (available from Fusion UV Systems, Gaithersburg Md.), operated at 100% power. The UV Fusion chamber was supplied with a flow of nitrogen that resulted in an oxygen concentration of approximately 50 ppm in the chamber.

Example 5: Nanoporous Coating with $ZrO_2$-Based High RI Backfill (5 wt-%)

The stock coating solution was diluted to 5 wt-% for Example 5 using 1:2 ratio of 1-methoxy-2-propanol/IPA. The 5% wt solutions was coated on the flexible thin coating carried on RF52N or 3SAB as described previously. Like Example 4, the flow rate was 6.6 cc/min cc/min and the slot coating die uniformly distributed a 10.2 cm wide coating onto a substrate moving at 10 ft/min. Next, the coating was polymerized by passing the coated substrate through a UV-LED cure chamber that included a quartz window to allow passage of UV radiation. The LEDs (available from Cree, Inc., Durham N.C.) operated at a nominal wavelength of 385 nm, and were run at 45 Volts at 1.5 Amps. After being polymerized by the UV-LEDs, the solvents are dried and the coating was post-cured the same way as Example 1 described above to result in a highly diffuse optical article with 88.2% Transmission, 73.5% Haze and 90.2% Clarity. This porous coating was then over-coated with $ZrO_2$-based high RI backfill solution that differs slightly from the previous high RI solution that was applied by handspread for example 3. For this example, the high RI coating solution was prepared according to the procedures and materials of Example 3 of U.S. Pat. No. 8,343,622 B2 (Liu et al). The RI of this high RI backfill made in this case is 1.69 as measured at 632.8 nm.

As in Example 4, in order to fill the porous structure with high Refractive Index backfill solution, 15 wt-% of $ZrO_2$-based backfill solution (described above) was syringe-pumped into a 4 inch wide slot-type coating die, and distributed to a homogenous 10.2 cm wide coating on the porous coating with a flow rate of rate of 8.2 cm³/min. For this fill coating, the porous substrate moving at 10 feet/min. The coating solution was dried after two 5 yard long oven set-up at 190 F. Next, the dried coating was post-cured using a Fusion System Model I300P configured with an H-bulb (available from Fusion UV Systems, Gaithersburg Md.), operated at 100% power. The UV Fusion chamber was supplied with a flow of nitrogen that resulted in an oxygen concentration of approximately 50 ppm in the chamber.

Measurement Results from Examples

OLED Testing

The angular color of a strong-cavity OLED device, commonly used in mobile phones, has a blue shift as the viewing angle increases. This effect is commonly referred to as off-angle color shift or angular color non-uniformity. The optical spectrum at three (3) selected viewing angles of a Samsung S5 mobile phone is illustrated in FIG. 8. The spectrum shows three (3) spectral peaks. Although the overall spectrum demonstrates a clear trend of shifting to shorter wavelength as the viewing angle increases, many other spectral parameters also vary—the spectral weights of the three distinct peaks change and the relative shift of each spectral peaks are different from each other.

The sample measurement method for OLED color shift utilized a Samsung S5 OLED mobile phone; the same Samsung S5 was used as the testbed for each of the diffuse adhesive samples in the comparison. One intended use of the moderately diffusing polymeric film is to incorporate into the OLED layers, preferably directly above the OLED pixels or above the TFE layer (thin film encapsulation). For this test, however, it is considered equivalent to measure color shifts and brightness with the polymeric film samples placed proximate but outside of the OLED device assembly. More specifically, samples were placed immediately above the touch panel display.

After mounting the samples onto the OLED device assembly, a blank white image was then displayed on the OLED screen. Next, the OLED panel assembly was mounted on a rotation stage to enable angular adjustment relative to the measuring spectrophotometer. For this test system, a PR650 spectrophotometer (PhotoResearch Inc., Syracuse, N.Y.) was used to measure the color and luminance intensity of the testing assembly at every 5 degree incremental rotation angle.

Figure 9:
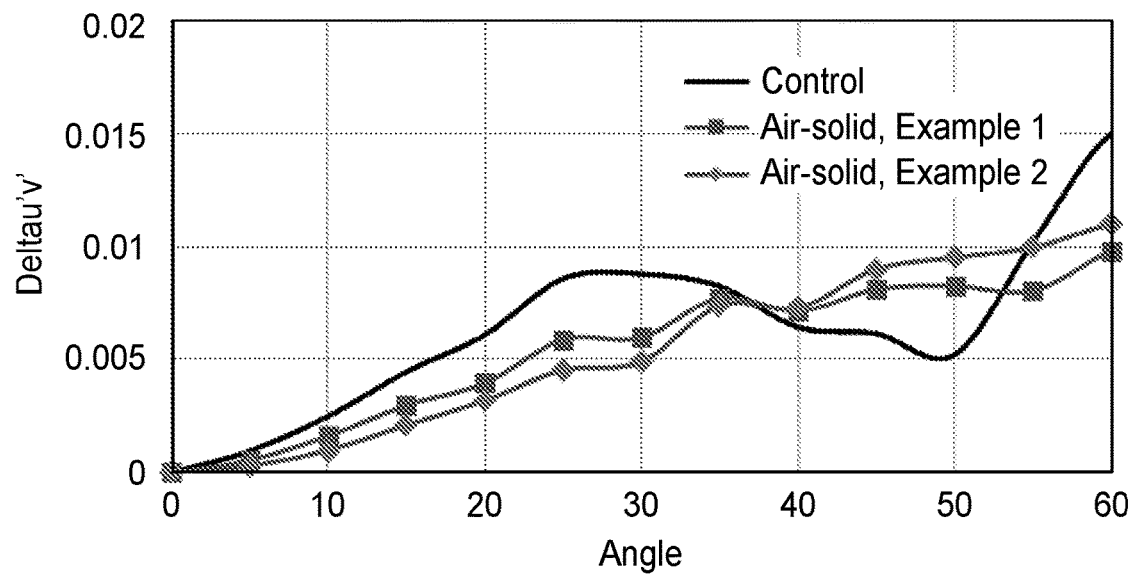
FIG. 9 is an exemplary plot of off-angle color shift (as represented by the corresponding shift in CIE (Commission on Illumination) color coordinates) versus viewing angle with and without a Wide View Color (WVC) correction polymeric film.

For each sample in this evaluation, the angular color shift (delta_u'v') of the OLED device with a Wide View Color (WVC) correction polymeric film was plotted and compared to the same OLED without a WVC correction polymeric film (control). An exemplary plot is shown in FIG. 9 comparing Example 1 and 2 Air-filled nanoporous structure to control. The WVC correction polymeric film helps to substantially reduce the angular color shift of the OLED device. The maximum color shift from 0-60 degrees was reduced from delta_u'v'=0.015 (control) to delta_u'v'=0.010 (with polymeric film), representing a 33% reduction.

As shown in FIG. 9, the WVC correction polymeric film (Example 2: air-filled nanoporous structure) also significantly reduce the color ship of the OLED devices.

We also investigated film with solid backfill. Because the solid backfill reduces the refractive index difference in the material, the process has been tuned and the resulting air-solid film performance is modified as shown in figure bellow.

Figure 10:
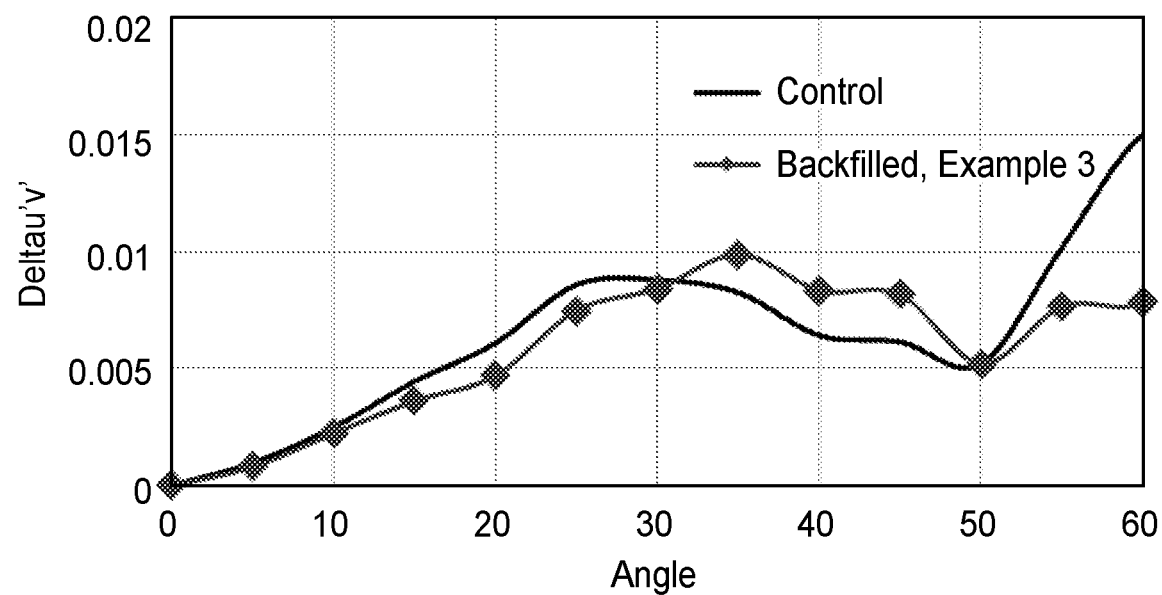
FIG. 10 is a graph of the angular color shift of the OLED device with the WVC material B with $ZrO_2$ backfill.

The porous coating made in Example 2 was further coated with ZrO2 backfill. The results are shown below in FIG. 10 (Example 3 high index-filled nanoporous structure compared to control film. Color uniformity has been improved most notably at large viewing angles.

The summary of the material performance is listed in the table bellow

TABLE 3

| Examples | | T [%] | H [%] | C [%] | delta_u'v' (max @0-60) | delta_u'v' (max @0-60) [%] | Normalized brightness |
|---|---|---|---|---|---|---|---|
| EX-1 | Air-filled | 88.8 | 59 | 96.2 | 0.010 | 33% | 82% |
| EX-2 | Air-filled | 87.3 | 84.6 | 93.2 | 0.011 | 27% | 67% |
| EX-3 | High RI filled | 89.2 | 16.9 | 99 | 0.010 | 33% | 93% |
| | Control | | | | 0.015 | | 100% |

As a figure of merit for the off-angle color shift, it is common to represent the color shift from the corresponding shift in CIE (Commission on Illumination) color coordinates. The CIE color coordinates (u,v) are measures for differing angles and the metric for color shift can be represented by delta_u'v' as expressed in equation A.

$$\text{delta\_}u'v'=\{[u'(\theta)-u'(0)]^2+[v'(\theta)-v'(0)]^2\}^{0.5}; \quad (A)$$

One main advantage of the illustrated WVC technology is that it has the potential to keep the core or functional material thickness very thin. The nanoporous layer with either air-filled or high RI-filled cases has thickness in the range of 500 nm~10 microns. Lateral light diffusing through this thin layer is very small, thus the visual blur of the OLED pixel is minimal as long as the WVC material is incorporated very close to the OLED pixel.

TABLE 4

| Example | T [%] | H [%] | C [%] | delta_u'v' (max @0-60) | delta_u'v' (max @0-60) [%] | Axial Brightness [%] | Normalized Micro-Haze [%] | Micro Haze Uniformity |
|---|---|---|---|---|---|---|---|---|
| EX-4 | 88.7 | 30.9 | 95.9 | 0.007 | 46% | 88% | 5.1% | 8% |
| EX-5 | 89.4 | 20.1 | 93.7 | 0.008 | 38% | 93% | 3.6% | 11% |
| PET (reference) | | | | 0.013 | | 100% | 1.2% | 3% |

The complete disclosures of the patents, patent documents, and publications cited herein are incorporated by reference in their entirety as if each were individually incorporated. Various modifications and alterations to this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

What is claimed is:

1. A display device comprising:
an organic light emitting diode panel having a multilayer construction comprising one or more adhesive films; and
a polymeric film incorporated within the multilayer construction of the organic light emitting diode panel;
wherein the polymeric film comprises:
a first polymeric layer having two major surfaces, wherein the two major surfaces are not microstructured, and wherein the first polymeric layer comprises:
a first polymer region comprising a first material having a refractive index of $n_1$;
a second region comprising a network of interconnected pores and channels within the first polymer region;
wherein the channels comprise a second material having a refractive index of $n_2$; and
wherein the first material comprises a first elastic polymeric material and optional particles; and
wherein the second material comprises:
a second polymeric material and optional particles; and/or air; and
wherein the polymeric film has:
a clarity of at least 90%;
a visible light transmission of at least 80%; and
a bulk haze of 25% to 80%.

2. The display device of claim 1 wherein the polymeric film has a normalized micro-haze non-uniformity of not more than 12% across the polymeric film.

3. The display device of claim 1 wherein the polymeric film has a thickness of at least 1 micron and up to 50 microns.

4. The display device of claim 1 wherein the difference between $n_1$ and $n_2$ is at least 0.01 unit.

5. The display device of claim 1 wherein the first elastic polymeric material is present in amount of 35 vol-% to 90 vol-%, based on the total volume of the polymeric film.

6. The display device of claim 1 wherein the first elastic polymeric material is a cured product of multifunctional monomers, oligomers, and optional surface modified nanoparticles.

7. The display device of claim 1 wherein the second material is a polymeric material present in the amount of 10 vol-% to 65 vol-%, based on the total volume of the polymeric film.

8. The display device of claim 7 wherein the second polymeric material comprises an organic polymer selected from the group of an acrylate, a polyolefin, a polyurethane, a silicone, a polyester, and a combination thereof.

9. The display device of claim 8 wherein the first material and/or second material comprises particles.

10. The display device of claim 9 wherein the particles comprise inorganic nanoparticles selected from the group of $ZrO_2$, $SiO_2$, $TiO_2$, $SnO_2$, and combinations thereof.

11. The display device of claim 1 wherein the second material comprises air.

12. The display device of claim 11 comprising a volume fraction of the second region comprising the network of interconnected pores and channels is at least 10%.

13. The display device of claim 1 wherein the pores and channels have an average cross-section of no greater than 2 microns.

14. The display device of claim 1 wherein the polymeric film further comprises a second polymeric layer disposed on one or both major surface(s) of the first polymeric layer; wherein the second polymeric layer comprises a third polymeric material having a refractive index $n_3$; wherein the first polymeric material and the third polymeric material are the same or different.

15. The display device of claim 14 wherein the second polymeric material and/or third polymeric material is an adhesive.

16. The display device of claim 15 wherein the adhesive is an optically clear adhesive.

17. The display device of claim 16 wherein the first and second materials form a porous structure, and the second polymeric layer is a capping layer, wherein the capping layer is not penetrated or only partially penetrated into a portion of the porous structure.

18. The display device of claim 17 wherein the capping layer comprises a polymeric material that is the same as the first non-adhesive polymeric material.

* * * * *